United States Patent [19]

Kuznetsov et al.

[11] 4,318,975

[45] Mar. 9, 1982

[54] DRY FILM MULTILAYER PHOTORESIST ELEMENT

[76] Inventors: Vladimir N. Kuznetsov, ulitsa Jubileinaya, 6, kv. 73; Nadezhda F. Smirnova, ulitsa Sovetskaya, 13, kv. 33; Vladimir D. Karpov, ulitsa Kirova, 60, all of Istra Moskovskoi oblasti, U.S.S.R.

[21] Appl. No.: 205,444

[22] PCT Filed: Dec. 14, 1979

[86] PCT No.: PCT/Su79/00131

§ 371 Date: Aug. 25, 1980

§ 102(e) Date: Aug. 4, 1980

[87] PCT Pub. No.: WO80/01321

PCT Pub. Date: Jun. 26, 1980

[30] Foreign Application Priority Data

Dec. 25, 1978 [SU] U.S.S.R. .................. 2695701

[51] Int. Cl.³ .................................. G03C 1/78
[52] U.S. Cl. .......................... 430/260; 430/262; 430/263; 430/271; 430/273; 430/281
[58] Field of Search ............ 430/260, 262, 263, 271, 430/273, 281

[56] References Cited

U.S. PATENT DOCUMENTS

| | | | |
|---|---|---|---|
| 3,661,576 | 5/1972 | Crary | 430/271 |
| 3,754,920 | 8/1973 | Kuchta | 430/271 |
| 3,873,319 | 3/1975 | Berg | 430/271 |
| 4,247,619 | 1/1981 | Cohen et al. | 430/271 |
| 4,262,080 | 4/1981 | Frosch et al. | 430/271 |

*Primary Examiner*—Jack P. Brammer
*Attorney, Agent, or Firm*—Steinberg & Raskin

[57] ABSTRACT

A dry film photoresist consisting of a two-layer base incorporating a solid polymeric substrate with a thickness of from 15 to 100$\mu$ and an intermediate polymeric layer with a thickness of from 3 to 15$\mu$ transparent to UV-radiation within the range of from 300 to 400 nm, a light-sensitive layer with a thickness of from 4 to 20$\mu$ and a protective polymeric film with a thickness of from 5 to 50$\mu$. All four of these layers are bonded therebetween by adhesion forces so that the adhesion of the protective polymeric film to the light-sensitive layer is less than the cohesion strength of the light-sensitive layer; the adhesion of the solid polymeric substrate to the intermediate polymeric layer is less than the adhesion of the intermediate polymeric layer to the light-sensitive layer and the adhesion force of each of the three above-mentioned layers is less than the cohesion strength of each of said layers.

12 Claims, No Drawings

DRY FILM MULTILAYER PHOTORESIST ELEMENT

TECHNICAL FIELD

The present invention relates to materials for printing circuit boards and, more specifically, to dry film photoresists.

These dry photoresists are useful in the manufacture of printed circuit boards and other articles with a sophisticated pattern of conductors, including hybrid integrating circuits.

BACKGROUND ART

Known in the art are dry film photoresists comprising flexible laminar systems incorporating a solid polymeric base (substrate)-usually polyethyleneterephthalate with a thickness of 20-25μ, an adhesive (especially upon heating) light-sensitive layer with a thickness of essentially 18-100μ and a protective polymeric film (generally polyethylene film) preventing the light-sensitive layer from dust and sticking when reeled (cf. British Pat. No. 1,361,298 Cl. C3G2, published July 1974; U.S. Pat. No. 3,873,319 Cl. 96-87R, published Mar. 25, 1975).

One of the prior dry film photoresists comprises a flexible laminary system incorporating a solid polyethyleneterephthalate substrate with a thickness of from 5 to 100μ, a light-sensitive layer with a thickness of from 5 to 1,000μ containing a light-sensitive compound capable of forming free radicals upon exposure to UV-light-ethyl ether of benzoin, a saturated compound containing in its molecule ethylene-type

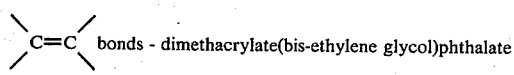
bonds - dimethacrylate(bis-ethylene glycol)phthalate and a product of addition of methacrylic acid to epoxy resin based on 4,4'-dihydroxy-2,2-diphenylpropane and a polymer which is a film-forming component of the light-sensitive layer-a copolymer of styrene with monoisobutyl ether of fumaric acid (50:50 mol.%), and a protective polymer film with a thickness of from 5 to 100μ being over the light-sensitive layer so that the adhesion of the protective film to the light-sensitive layer is smaller than the adhesion of the solid polymer substrate (polyethyleneterephthalate film) to the light-sensitive layer; adhesion values of the layers are inferior to the cohesion values of these layers thus providing the possibility of a successive stripping-off first of the protective film and then the solid polymer substrate from the light-sensitive layer.

The light-sensitive layer may also incorporate a dyestuff such as "methyl violet", a radical-polymerization inhibitor such as hydroquinone, a plastifying agent such as glycerol-1,3-dipropionate (cf. British Pat. No. 1,549,952 Cl. G 03 C 1/68 1/71//C 08 F 2/50, published Aug. 8, 1979).

Resolution of dry film photoresists depends, to a considerable extent, on the thickness of their transparent polymeric base (substrate) which separates the photographic template from the light-sensitive layer upon exposure. When a thinner base is used, the pattern of the protective relief is less distorted and the resolving power of a dry film photoresist is increased.

However, the use of a film base with a thickness of below 20μ in the manufacture of the prior art photoresist causes difficulties associated with casting of the lightsensitive layer and drying thereof due to a low mechanical strength of thin films and possibilities of their warping especially inside the hot section of the drying chamber of a casting machine, as well as upon the application of the photoresist onto board blanks thus causing undergrade quality of the resulting articles. Thus, upon casting of the lightsensitive layer onto a polyethyleneterephthalate film with a thickness of 10μ polymeric substrate warping as high as 5 mm is observed. The difference in thickness of the light-sensitive layer in this case may be as high as 30 to 50% and over. During the application of such a photoresist onto board blanks by means of a roller-type laminator folds are formed which break the integrity of the light-sensitive layer due to a strong deformation of the base. For this reason the prior at photoresists have a thicker base (20-25μ and above) thus ensuring a lesser warping in the manufacture and use of photoresists.

Therefore, the above-mentioned limitations substantially restrict the field of application of known dry film photoresists.

DISCLOSURE OF INVENTION

It is an object of the present invention to provide dry film photoresists which have a high resolving power (minimally reproducible line of 5 to 40μ) and are warp-resistant in manufacture and use.

This object of the present invention is accomplished by the provision of a dry film photoresist comprising a flexible laminated system incorporating a solid polymer substrate with a thickness of from 15 to 100μ, a light-sensitive layer with a thickness of from 4 to 20μ containing at least one light-sensitive compound capable of forming free radicals upon exposure to UV-light, at least one unsaturated compound containing in its molecule ethylene-type

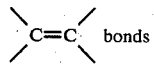
bonds and at least one polymer which is a film-forming component of the light-sensitive layer; and a protective polymer film with a thickness of from 5 to 50μ placed over the light-sensitive layer, wherein in accordance with the present invention between said solid polymeric substrate and the lightsensitive layer there is interposed an intermediate polymeric layer transparent to UV-light within the range of from 300 to 400 nm and having a thickness of from 3 to 15μ consisting of a polymer alcohol, or polymer ester, or polyamide, or a halogenated polymer, or polyacrylonitrile, or a mixture thereof; all the four above-mentioned layers are bonded therebetween by means of adhesion forces so that the adhesion of the protective polymeric film to the light-sensitive layer is less than the cohesion strength of the light-sensitive layer and the adhesion of the solid polymeric substrate to the intermediate layer is less than the adhesion of the intermediate layer to the light-sensitive layer, while the adhesion of each of the above-mentioned three layers is less than the cohesion strength of each of these layers.

It is advisable that as the polymeric alcohol the abovementioned intermediate layer of the dry film photoresist according to the present invention contain watersoluble methylcellulose or polyvinylalcohol.

It is also advisable that as the polymeric ester the intermediate polymeric layer of the dry film photoresist according to the present invention contain cellulose triacetate or polyethyleneterephthalate.

It is desirable that as the polyamide the intermediate polymeric layer of the dry film photoresist according to the present invention contain polyhexamethyleneadipamide or gelatine.

It is also desirable that as the halogenated polymer the intermediate polymeric layer of the dry film photoresist according to the present invention contain a copolymer of tetrafluoroethylene or trifluorochloroethylene with vinylidene fluoride.

It is preferable that as the polyacrylonitrile the intermediate polymeric layer of the dry film photoresist according to the present invention contain a polymer of acrylic acid nitrile.

Among other possible embodiments it should be noted that the intermediate polymeric layer can also incorporate dyestuffs in an amount of from 0.01 to 1.0% by weight of the intermediate polymeric layer.

As the dyestuff it is advisable to use rhodamine GG (G), C.I. No. 45160 (752).

It is also advisable that the intermediate polymeric layer of the dry film photoresist according to the present invention contain a plastifying agent in an amount of from 5 to 15% by weight of the intermediate polymeric layer.

As the plastifying agent in said intermediate polymeric layer of the dry film photoresist use may be made of hydroxyethylated dodecylphenol.

It is desirable that the intermediate polymeric layer of the dry film photoresist according to the present invention also contain surfactants in an amount of from 0.1 to 0.5% by weight of said intermediate polymeric layer.

As the surfactant in the intermediate polymeric layer of the dry film photoresist it is desirable to use a sodium salt of dibutylnaphthalene sulphonic acid.

The dry film photoresist according to the present invention makes it possible to obtain a resolving power sufficient to produce conductors of printed circuit boards with a thickness of from 5 to 50μ, the photoresist is warp-resistant to deformations of the substrate and the light-sensitive layer in the manufacture and use thereof.

Best Mode for Carrying Out the Invention

The dry film photoresist according to the present invention is produced in the following preferred manner.

Onto the surface of a solid polymeric substrate-film made of regenerated cellulose (cellophane), polyethyleneterephthalate, polyamides such as poly-m-phenyleneisophthalamide (phenylone), polyimides such as polypyromellitimide, cellulose triacetate or other film materials possessing adequately high cohesion strength and having thickness of from 15 to 100μ there is applied, by casting, a 5 to 20% solution of a polymer transparent to UV-radiation within the range of from 300 to 400 nm, a polymeric alcohol such as a solution of polyvinyl alcohol with a content of the residual acetate groups of from 3 to 20 mol.%, methylcellulose with a substitution degree of 1.25 to 1.6, a halogenated polymer such as a copolymer of vinylidene fluoride with tetrafluoroethylene, a copolymer of vinylidene fluoride with hexafluoropropylene, a copolymer of vinylidene fluoride with trifluorochloroethylene, a polyamide, i.e. a polymer with its molecule containing a radical —NH—CO—, photographic gelatine, polyhexamethyleneadipamide, poly-ε-caproamide, a mixed polyamide (50:50 mol.%)-polyhexamethylene(adip/sebac)amide, a polymeric ester such as cellulose acetates, polyethyleneterephthalate, polyacrylonitrile such as a polymer of acrylic acid nitrile, or mixtures thereof. In addition, the polymer solution can also contain dyestuffs such as rhodamin GG (G), basic blue "K" (C.I. No. 44040), methyl violet (C.I. No. 42535) in an amount of from 0.01 to 1.0% by weight of the intermediate polymeric layer, plastifying agents such as hydroxyethylated dodecylphenol with a molecular weight of 500 units in an amount of from 5 to 15% by weight of the polymer and surfactants such as disodium salt of dibutylnaphthalenesulphonic acid in an amount of from 0.1 to 0.5% by weight of the polymer. The cast layer is dried at a temperature within the range of from 30° to 120° C. for a period of from 0.5 to 5 minutes. Thereafter, onto the surface of the dried intermediate polymeric layer with a thickness of from 3 to 15μ there is cast a 10-40% solution containing at least one light-sensitive compound capable of forming free radicals upon exposure to UV-radiation such as aromatic ketones, aromatic diketones, polynucleous quinones: 4,4'-bis(diethylamino)benzophenone, fluorenone, 2-tert.butylanthraquinone, benzoin methylate, Michler ketone; at least one unsaturated compound containing in its molecule ethylene-like

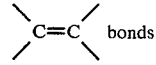

such as acrylic esters of polyhydric alcohols, unsaturated amides: pentaerythritoltriacrylate, triethyleneglycol dimethacrylate, pentaerythritoltetraacrylate, trimethylolpropane triacrylate, methacrylamide, acrylamide; at least one polymer comprising a film-forming component of the light-sensitive layer; the polymer can simultaneously act as said light-sensitive compound and/or unsaturated compound, for example, polymethylmethacrylate, a copolymer of styrene with mono-n-butylfumarate, a copolymer of styrene with monoisoamylmaleate, methacrylated resin based on 2,2-bis(4'-hydrxyphenyl)propane with a molecular weight of 600 units, a product of interaction of epoxy resin based on 2,2-bis(4'-hydroxyphenyl)-propane with acrylic anhydride (molecular weight of 1,500 units), a product of interaction of epoxy resin based on 2,2-bis(4'-hydroxyphenyl)-propane with p-benzoylbenzoic acid and acrylic anhydride (molecular weight of 1,650 units, the content of combined p-benzoylbenzoic acid of 5.2% by weight), a product of chemical addition of p-benzoylbenzoic acid to epoxy resin based on 2,2-bis-(4'-hydroxylphenyl)propane (molecular weight 1,200 units, the content of combined p-benzoylbenzoic acid is 20.1% by weight). Furthermore, the solution of the light-sensitive composition can incorporate dyestuffs such as methyl violet, crystalline violet, basic blue "K" in an amount of from 0.1 to 5.0% by weight of the polymer; inhibitors of radical polymerization such as phenols: hydroquinone, p-methoxyphenol, in an amount of from 0.01 to 5.0% by weight of the polymer; plastifying agents such as triethyleneglycol diacetate.

The thus-formed light-sensitive layer is dried at a temperature within the range of usually from 20° to 150° C. for 0.5 to 5 minutes by air-blowing.

Then onto the light-sensitive layer with a thickness of from 4 to 20μ there is applied by means of, for example a rubber-coated roller, a protective polymeric film with a thickness of 5 to 50μ made of, for example, polyethylene, polypropylene, polyisobutylene, polytetrafluoroethylene and other film-forming polymers.

Therefore, the resulting dry film photoresist comprises a flexible four-layer system, wherein all the four layers are bonded therebetween by adhesion forces so that the adhesion of the protective polymer to the light-sensitive layer is less than the cohesion strength of the light-sensitive layer and the adhesion of the solid polymer substrate to the intermediate polymeric layer is less than the adhesion of the intermediate polymer layer to the light-sensitive layer, while the adherence of each of said three layers is less than the cohesion strength of each of these layers.

The dry film photoresist possesses a high resolving power (minimally reproducible line of 5 to 50μ) and, owing to the presence of a two-layer substrate with a thickness of from 27 to 108μ consisting of a solid polymeric substrate and an intermediate polymeric layer, it is substantially more resistant to warping both in manufacture and use.

The mode of application of the dry film photoresist according to the present invention consists in the following.

Prior to the deposition of the dry film photo-resist onto the substrate, the protective polymeric film is removed (stripped-off) in a mechanical way. Then onto a substrate made of a metal such as copper, silver, nickel, a nonmetal such as sital or a semi-conductor such as germanium, silicon, there is applied, by rolling at a temperature of from 100° to 120° C. or pressing-on at a temperature of from 50° to 130° C., a flexible laminated system containing a solid polymeric substrate with a thickness of from 15 to 100μ, an intermediate polymeric layer transparent to UV-radiation within the range of from 300 to 400 nm with a thickness of from 3 to 15μ and a light-sensitive layer with a thickness of from 3 to 40μ. Then the flexible polymeric substrate is removed (stripped-off) from the surface of the intermediate polymeric layer and a phototemplate is placed onto the surface of the intermediate polymeric layer containing the image to be reproduced; the light sensitive layer is exposed through the phototemplate and the intermediate layer, the template is removed along with the intermediate polymeric layer from the surface of the light-sensitive layer. The removal of the intermediate polymeric layer is effected by stripping-off or by dissolution in an appropriate solvent, or it is effected simultaneously with the development so that the intermediate polymeric layer is dissolved in the developer of the lightsensitive layer.

After the removal of the intermediate polymeric layer the light-sensitive layer is developed in an appropriate developing agent selectively dissolving the non-exposed areas.

For a better understanding of the present invention, some specific examples illustrating its embodiments are given hereinbelow.

EXAMPLE 1

A dry film photoresist incorporates a solid substrate of a polyethyleneterephthalate film with a thickness of 40μ and an intermediate layer, deposited thereonto, of methylcellulose with the degree of substitution of 1.4 and thickness of 8μ. Over the layer of methylcellulose a lightsensitive layer is deposited which has the following composition, g:

polymethylmethacrylate—100
pentaerythritol triacrylate—70
triethyleneglycol dimethacrylate—15
4,4'-bis(diethylamino)benzophenone—5
fluorenone
dyestuff "methyl violet"—0.25
hydroquinone—0.02

A reel of the photoresist is placed into a roller-type laminator provided with a means for mechanical stripping-off and winding of the protective polyethylene film with a thickness of 20μ. The application of the photoresist is conducted at a temperature of 115° C. of the heating elements and a speed of 1 m/min over the pre-treated surface of a copper foil. Then the polymeric substrate of the photoresist (polyethyleneterephthalate film) is stripped-off from the resulting sample. In doing so, the intermediate layer consisting of methylcellulose remains on the surface of the light-sensitive layer. Prior to exposure a photographic template is placed over the layer of methylcellulose.

For the purpose of exposure use is made of a 1 kW mercury high-pressure lamp. The exposure time is 40 sec. After exposure methylcellulose is washed with water from the surface of the light-sensitive layer, the latter is then developed on a stream unit for a period of 60 seconds. The resulting protective relief well reproduces the pattern of the template. The minimal reproducible line of the template is 30μ.

A high thickness of the base (48μ for both layers) solid polymeric base and the intermediate layer) facilitates casting and drying of the light-sensitive layer, as well as application of the photoresist onto the substrate, prevents the polymeric base from warping and the light-sensitive layer from deformation. The warping of the base in this case does not exceed 1.5 mm. The prior art dry film photoresist incorporating a single-layer polyethyleneterephthalate base of the same thickness (48μ) has a substantially lower resolving power. The minimal reproducible line under the same test conditions is 150μ. In the case of using the prior art photoresist having a single-layer base of methylcellulose with a thickness of 8μ, warping is as high as 6 mm and causes damage of the light-sensitive layer due to the formations of folds on the photoresist film.

EXAMPLE 2

A dry film photoresist contains a film base consisting of a substrate based on cellulose triacetate with a thickness of 100μ and an intermediate layer based on polyvinyl alcohol with a content of the residual acetate groups of 10 mol.% and a thickness of 3μ. Onto the surface of the layer of polyvinyl alcohol there is applied a light-sensitive layer with the thickness of 10μ having the following composition, g:

copolymer of styrene with mono-n-butylether of fumaric acid (50 mol.% of the latter)—100
pentaerythritol triacrylate—40
pentaerythritol tetraacrylate—20
trimethylolpropane triacrylate—10
methacrylamide—10
2-tert.butylanthraquinone—12
dyestuff "methyl violet"—0.2
p-methoxyphenol—0.01.

Prior to the application of the photoresist, the protecting polyethylene film with a thickness of 40μ is stripped-off, the dry film photoresist is applied onto the surface of the copper substrate by means of a press-laminator at a temperature of 80° C. in a vacuum of 5 mm Hg. Then the the polymeric film based on cellulose triacetate is stripped off from the resulting sample and exposed as described in the foregoing Example 1.

The exposure time is 54 sec. The development of the light sensitive layer is effected by means of a 1% aqueous solution of sodium carbonate. The layer of polyvinyl alcohol positioned on the surface of the light-sensitive layer is dissolved during the development.

The minimal reproducible line is 20μ. The base warping does not exceed 1 mm. The prior art dry film photoresist incorporating a single-layer of cellulose triacetate of the same thickness (103μ) has a lower resolving power and reproduces lines with a minimal thickness of 250μ under similar testing conditions.

The manufacture of the prior art photoresist with a single-layer base of polyvinyl alcohol with a thickness of 3μ is impossible due to considerable warping of the base and low strength thereof hindering the casting of the lightsensitive layer.

EXAMPLE 3

A dry film photoresist incorporates a film base consisting of a polyethyleneterephthalate substrate with a thickness of 25μ and an intermediate polymeric layer based on a copolymer of vinylidene fluoride with hexafluoropropylene with a thickness of 7μ. A light-sensitive layer with a thickness of 7μ having the same composition as in the foregoing Example 2 is deposited onto the surface of the intermediate layer of the base. The photoresist is applied onto a copper substrate at a temperature of 100° C. following the procedure described in Example 2. The polyethyleneterephthalate substrate is stripped-off prior to exposure. The exposure time is 45 sec. After the exposure the intermediate polymeric layer positioned over the surface of the light-sensitive layer is removed by mechanical way (stripped-off) as well. The development is conducted as described in Example 2. The prior art dry film photoresist incorporating a single layer polyethyleneterephthalate base with a thickness of 32μ is capable of reproducing lines with a minimal thickness of 120μ.

The prior art photoresist with a single-layer base of a copolymer of vinylidene fluoride with hexafluoropropylene with a thickness of 7μ has warping of up to 10 mm due to stretching of the base upon its displacement, thus hindering the use of the photoresist.

EXAMPLE 4

A dry film photoresist incorporates a film base consisting of a solid polymeric substrate based on cellulose triacetate with a thickness of 70μ and an intermediate polymeric layer of photographic gelatine of a thickness of 10μ. Onto the surface of the intermediate polymeric layer a light-sensitive layer with a thickness of 20μ and having the same composition as in Example 2 is applied. The photoresist is deposited as described in Example 2 hereinbefore. The layer of gelatine placed upon the surface of the light-sensitive layer dissolver during the development. The development is effected as in Example 2. The minimal reproducible line is 30μ. The base warping does not exceed 1.5 mm. The prior art dry film photoresist incorporating a single-layer base of cellulose triacetate with a thickness of 80μ reproduces lines with a minimal thickness of 200μ. The prior art dry film photoresist with a single-layer base of gelatine with a thickness of 10μ has only a low mechanical strength and warping of up to 10 mm, thus hindering its use.

EXAMPLE 5

A dry film photoresist incorporates a film base consisting of a film of regenerated cellulose (cellophane) with a thickness of 40μ and an intermediate polymeric layer of a film based on polyvinyl alcohol with a content of residual acetate groups of 3 mol.% and an additive of 10% (by weight of the layer) of hydroxyethylated dodecylphenol with a molecular weight of 500 units and an additive of 0.75% (by weight of the layer) of the dyestuff rhodamine GG(G) with a thickness of 15μ. Onto the surface of the dyed intermediate layer a light-sensitive layer is deposited with a thickness of 15μ and having the same composition as in Example 2 hereinbefore. The use of the photoresist is similar to that mentioned in Example 2. The layer of polyvinyl alcohol is dissolved during the dvelopment. The development is effected as in Example 2. The minimal reproducible line is 40μ. The base warping does not exceed 2 mm. The prior art dry film photoresist incorporating a single-layer cellophane base with a thickness of 55μ has a lower resolving power and reproduces lines with a minimal width of 150μ. The prior art photoresist with a single layer base of polyvinyl alcohol with a thickness of 15μ and the same composition possesses an unsatisfactory mechanical strength and has base warping of up to 8 mm.

EXAMPLE 6

A dry film photoresist contains a film base consisting of poly-m-phenyleneisophthalamide substrate with a thickness of 30μ and an intermediate polymeric layer from a copolymer of vinylidene fluoride with tetrafluoroethylene with a thickness of 5μ. Onto the surface of the intermediate layer a light-sensitive layer with a thickness of 10μ having the same composition as in Example 2 is deposited. The intermediate layer positioned on the surface of the light-sensitive layer is removed mechanically (stripped-off) prior to the development. The development is effected as in Example 2. The minimal reproducible line is 20μ. The base warping does not exceed 2 mm. The prior art dry film photoresist containing a single-layer base of poly-m-phenyleneisophthalamide with a thickness of 35μ reproduces lines with a minimal width of only 120μ. The prior art dry film photoresist with a single-layer base of a copolymer of vinylidene fluoride with tetrafluoroethylene with a thickness of 5μ has a low mechanical strength and warping of up to 10 mm hindering its use.

EXAMPLE 7

A dry film photoresist contains the same layers as the photoresist described in Example 6, except that instead of the copolymer of vinylidene fluoride with tetrafluoroethylene use is made of a copolymer of vinylidene fluoride with trifluorochloroethylene. The photoresist tests are performed as described in Example 6. The photoresist characteristics are not changed and correspond to the characteristics of the dry film photoresist of Example 6.

EXAMPLE 8

A dry film photoresist contains a film base consisting of a polyethyleneterephthalate substrate with a thickness of 15μ and an intermediate polymeric layer with a thickness of 12μ of polyhexamethyleneadipamide. Onto the surface of the intermediate layer there is deposited a light-sensitive layer with a thickness of 10μ of the same composition as in Example 2. The intermediate polyhexamethyleneadipamide layer located on the surface of the light-sensitive layer is removed (stripped-off) mechanically prior to the development. The development is effected as described in Example 2. The minimal reproducible line is 30μ. The base warping is 2.5 mm. The prior art photoresist containing a single-layer base of polyethyleneterephthalate with a thickness of 27μ reproduces lines with a minimal width of 75μ. The prior art photoresist with a single-layer base of polyhexamethyleneadipamide with a thickness of 12μ has base warping of up to 8 mm resulting in the formation of folds on the light-sensitive layer.

EXAMPLE 9

A dry film photoresist contains the same layers as the photoresist described in Example 8, except that as the polyhexamethyleneadipamide use is made of poly-ε-caproamide. The characteristics of the dry film photoresist remain unchanged and similar to those of the photoresist of Example 8.

EXAMPLE 10

A dry film photoresist contains a film base consisting of a polypyromellitimide substrate with a thickness of 30μ and an intermediate polymer layer of polyhexamethylene (adip/sebac)amide (50:50 mol.%) with a thickness of 10μ. Onto the surface of the intermediate layer a light-sensitive layer with a thickness of 15μ is deposited which has the same composition as in Example 2 hereinabove. The intermediate layer located on the surface of the light-sensitive layer is mechanically removed (stripped-off) prior to the development. The development is carried out as described in Example 2. The minimal reproducible line is 40μ. The base warping does not exceed 2 mm. The prior art dry film photoresist with a single-layer of polypyromellitimide film with a thickness of 40μ is capable of reproducing lines with a minimal width of 150μ. The prior art photoresist with a single layer of polyhexamethylene(adip/sebac)amide with a thickness of 10μ has an unsatisfactory mechanical strength and base warping of up to 8 mm which hinders its use.

EXAMPLE 11

A dry film photoresist contains a film base consisting of a polyethyleneterephthalate substrate with a thickness of 30μ and an intermediate polymeric layer of a copolymer of vinylidene fluoride with tetrafluoroethylene with a thickness of 4μ. Onto the surface of the intermediate layer there is applied a light-sensitive layer with a thickness of 4μ having the following composition, g:

copolymer of styrene with monoisoamyl maleate—100
pentaerythritol tetraacrylate—20
methacrylated resin based on 2,2-bis-(4'-hydroxyphenyl)propane (M.w. 600 units, the content of the residual epoxy groups 0.28 wt.%, acid number 3.7 mg KOH/g)—20
acrylamide—10
benzoin methylate—5
dyestuff "basic blue K"—0.35.

The dry film photoresist is subjected to the testing as described in Example 2 hereinbefore.

The intermediate layer located on the surface of the light-sensitive layer is mechanically removed (stripped-off) prior to the development. The developing agent is a 1% aqueous solution of sodium carbonate.

The minimal reproducible line is 5μ. The base warping does not exceed 2 mm.

The prior art dry film photoresist containing a single layer base of polyethyleneterephthalate with a thickness of 34μ reproduces lines with a minimal width of 90μ. The prior art dry film photoresist with a single-layer of a copolymer of vinylidene fluoride with tetrafluoroethylene with a thickness of 4μ possesses a low mechanical strength and base warping of up to 8μ hindering its use.

EXAMPLE 12

A dry film photoresist has the same composition as in the foregoing Example 1, the polyethyleneterephthalate substrate has a thickness of 100μ, the intermediate polymer layer-a thickness of 8μ, and the light-sensitive layer contains the following components, g:

product of interaction of epoxy resin based on 2,2-bis(4'-hydroxyphenyl)-propane with acrylic anhydride (M.w. 1,500 units, the content of residual epoxy groups of 0, acid number of 2.1 mg KOH/g, hydroxyl number of 3.2% by weight)—100
triethyleneglycol diacetate—10
Michler ketone—3
fluorenone—3 dyestuff basic blue "K"—0.25.

The thickness of the light-sensitive layer is 10μ.

The dry film photoresist is subjected to the tests described in Example 2 hereinabove. The intermediate layer is removed mechanically.

The developing agent is methylchloroform. The minimal reproducible line is 25μ. The base warping does not exceed 1 mm.

The prior art film photoresist with a single-layer base of polyethyleneterephthalate with a thickness of 108μ is capable of reproducing lines with a minimal width of 250μ. The prior art photoresist with a single-layer base of a copolymer of vinylidene fluoride with tetrafluoroethylene with a thickness of 8μ has base warping of up to 6 mm, hindering its use.

EXAMPLE 13

A dry film photoresist has the same composition and the layer thickness as in Example 12, though the light-sensitive layer has the following composition, g:

a product of interaction of epoxy resin based on 2,2-bis-(4'-hydroxyphenyl)propane with p-benzoylbenzoic acid and acrylic anhydride (M.w. 1,650 units, content of the residual epoxy groups is 0, acid number 1.6 mg KOH/g, hydroxyl number 3% by weight, the content of combined p-benzoylbenzoic acid is 5.2% by weight)—100
triethyleneglycol diacetate—10
dyestuff basic blue "K"—0.25.

The tests of the photoresist are conducted as described in the foregoing Example 12. The photoresist characteristics are the same as in Example 12.

EXAMPLE 14

The dry film photoresist is similar, as to its composition and thickness, to that described in Example 12, but its light-sensitive layer has the following composition, g:

a product of chemical addition of p-benzoylbenzoic acid to an epoxy resin based on 2,2-bis-(4'-hydroxyphenyl)-propane (M.w. 1,200 units, the content of the residual epoxy groups is 2.8% by weight, the acid number is 0.3 mg KOH/g, the hydroxyl number is 5.3% by weight, the content of combined p-benzoylbenzoic acid is 20.1%)—100 pentaerythritol tetraacrylate—20.

The photoresist is subjected to tests as described in Example 12. The photoresist characteristics remain unchanged.

EXAMPLE 15

A dry film photoresist contains a film base consisting of a polyethyleneterephthalate substrate with a thickness of 30μ and an intermediate polymer layer with a thickness of 9μ of polymeric acrylic acid nitrilecontaining 0.01% by weight of the dyestuff basic blue "K".

Onto the surface of the intermediate layer a light-sensitive layer is deposited with a thickness of 12μ having the composition described in Example 12.

The tests of the photoresists are carried out as described in Example 12.

The minimal reproducible line is 30μ. The base warping does not exceed 2.5 mm.

The dry film photoresist of the prior art with a singlelayer base of polyethyleneterephthalate with a thickness of 39μ is capable of reproducing lines with a minimal thickness of 70μ. The prior art photoresist with a single-layer base of polymeric nitrile of acrylic acid with a thickness of 9μ has warping of up to 6 mm.

EXAMPLE 16

A dry film photoresist has the same composition and thickness as that described in the foregoing Example 15, though its intermediate layer is made of cellulose diacetate.

The testing procedure and properties of the photoresist do not differ from those of Example 15.

EXAMPLE 17

A dry film photoresist contains a film base consisting of polypyromellitimide substrate with a thickness of 30μ and an intermediate polymeric layer with a thickness of 8 mcm of polyethyleneterephthalate. Onto the surface of the intermediate layer a light-sensitive layer with a thickness of 10μ and the composition of Example 12 is applied. The testing procedure is similar to that of Example 12. The minimal reproducible line is 25μ.

The base warping does not exceed 2.5 mm. The prior art film photoresist with a singlelayer base of polypyromellitimide layer with a thickness of 38μ is capable of reproducing lines with a minimal width of 70μ.

The prior art photoresist with a single-layer of polyethyleneterephthalate with a thickness of 8μ has warping of up to 6 mm.

EXAMPLE 18

A dry film photoresist contains a base consisting of a polyethyleneterephthalate substrate with a thickness of 40μ and an intermediate polymeric layer deposited thereonto and having a thickness of 6μ; it has the following composition, g:

methylcellulose with the substitution degree of 1.5—100 sodium salt of dibutylnaphthalene sulphonic acid—0.5 dyestuff rhodamine GG(G)—0.1

Over the intermediate layer a light-sensitive layer is applied which has the same composition as in Example 1 and a thickness of 15μ.

The testing procedure is similar to that described in Example 1. The minimal reproducible line is 30μ. The base warping does not exceed 1.5 mm.

The prior art dry film photoresist with a singlelayer base of polyethyleneterephthalate with the thickness of 46μ is capable of reproducing lines with a minimal thickness of 90μ.

The prior art photoresist with a single-layer base of methylcellulose of the above-mentioned composition and thickness of 6μ has a low mechanical strength which hinders its use.

EXAMPLE 19

A dry film photoresist has the same composition and thickness as in the foregoing Example 15, though its intermediate layer is made of cellulose triacetate.

The testing procedure and the photoresist characteristics are similar to those described in Example 15.

What we claim is:

1. A dry film photoresist which is a flexible laminated system comprising a solid polymeric substrate with a thickness of from 15 to 100μ, a light-sensitive layer having a thickness of 4 to 20μ comprising at least one light-sensitive compound capable of forming free radicals upon exposure to UV-radiation, at least one unsaturated compound containing in its molecule ethylene-like

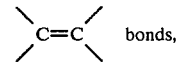

and also at least one polymer layer, and a protective polymeric film with a thickness of from 5 to 50μ located above the light-sensitive layer, characterized in that between the solid polymeric substrate and the light-sensitive layer there is an intermediate polymeric layer, transparent to UV-radiation within the range of 300 to 400 nm, having a thickness of 3 to 15μ consisting of a polymeric alcohol or a polymeric ester or a polyamide, or a halogenated polymer, or polyacrylonitrile, or mixtures thereof, all said four layers being bonded therebetween by adhesion forces so that the adhesion of said polymeric protective film to said light-sensitive layer is less than the cohesion strength of said light-sensitive layer, the adhesion of said solid polymeric substrate to said intermediate polymeric layer is less than the adhesion of said intermediate polymeric layer to the light-sensitive layer and the adhesion force of each of said three layers is less than the cohesion strength of each of said layers.

2. A dry film photoresist according to claim 1, wherein the intermediate polymeric layer contains a compound selected from the group consisting of water-soluble methylcellulose and polyvinyl alcohol.

3. A dry film photoresist according to claim 1, wherein the intermediate polymeric layer contains a compound selected from the group consisting of cellulose triacetate and polyethyleneterephthalate.

4. A dry film photoresist according to claim 1, wherein the intermediate polymeric layer contains a compound selected from the group consisting of polyhexamethyleneadipamide and gelatine.

5. A dry film photoresist according to claim 1, wherein the halogenated polymer its intermediate polymeric layer contains a compound selected from the group consisting of a copolymer of tetrafluoroethylene with vinylidene fluoride and a copolymer of trifluorochloroethylene with vinylidene fluoride.

6. A dry film photoresist according to claim 1, wherein the polyacrylonitrile its intermediate polymeric layer contains a polymeric nitrile of acrylic acid.

7. A dry film photoresist according to claim 1, wherein the intermediate polymeric layer also incorporates dyestuff in an amount of from 0.01 to 1.0% by weight of the intermediate layer.

8. A dry film photoresist according to claim 7, wherein the dyestuff its intermediate polymeric layer contains rhodamine GG (G).

9. A dry film photoresist according to claim 1, wherein the intermediate polymeric layer contains also plastifying agents in an amount of from 5 to 15% by weight of the intermediate layer.

10. A dry film photoresist according to claim 9 wherein the plastifying agent of the intermediate polymeric layer contains hydroxyethylated dodecylphenol.

11. A dry film photoresist according to claim 1, wherein the intermediate polymeric layer also contains surfactants in an amount of from 0.1 to 0.5% by weight of the intermediate layer.

12. A dry film photoresist according to claim 11, wherein the surfactant is a sodium salt of dibutylnaphthalenesulphonic acid.

* * * * *